(12) United States Patent
Ravatin et al.

(10) Patent No.: US 6,525,568 B2
(45) Date of Patent: Feb. 25, 2003

(54) CIRCUIT FOR THE DEMODULATION OF THE LOGIC SIGNAL TRANSMITTED BY ANALOG CHANNELS

(75) Inventors: Jean Ravatin, Moirans (FR); Michel Ayraud, Voreppe (FR)

(73) Assignee: Atmel Grenoble S.A., Saint-Egreve (FR)

(*) Notice: Subject to any disclaimer, the term of this patent is extended or adjusted under 35 U.S.C. 154(b) by 0 days.

(21) Appl. No.: 09/925,654

(22) Filed: Aug. 10, 2001

(65) Prior Publication Data
US 2002/0047730 A1 Apr. 25, 2002

(30) Foreign Application Priority Data
Aug. 11, 2000 (FR) .............................. 00 10583

(51) Int. Cl.[7] .......................................... H03K 19/0175
(52) U.S. Cl. ............................. 326/82; 326/62; 327/39; 327/323
(58) Field of Search ...................... 326/82, 62; 327/39, 327/323

(56) References Cited

U.S. PATENT DOCUMENTS

| 4,385,328 A | 5/1983 | Tanaka |
| 4,634,983 A | 1/1987 | Schemmel et al. |
| 5,459,311 A | * 10/1995 | Brosnan ................. 250/214 C |
| 5,706,221 A | 1/1998 | Paulsen |
| 5,909,143 A | 6/1999 | Weber |

FOREIGN PATENT DOCUMENTS

| DE | 32 03 559 | 8/1983 |
| EP | 0 639 002 | 2/1995 |
| GB | 1 340 821 | 12/1973 |
| GB | 2 062 421 | 5/1981 |
| GB | 2 135 852 | 9/1984 |

* cited by examiner

*Primary Examiner*—Daniel Chang
(74) *Attorney, Agent, or Firm*—Oblon, Spivak, McClelland, Maier & Neustadt, P.C.

(57) ABSTRACT

In digital signal demodulation and detection circuits, especially digital radio signal reception and processing circuits, the signals are received in analog form and have to be converted into logic levels. This is done in practice by comparing the level of the signal with its mean level. The mean level is established by an RC lowpass filter which introduces an inconvenient delay into the preparation of the mean level. The mean level of the signal, established by an RC filter is compared and applied to an input B of a comparator COMP, at the level of the analog signal delayed by a phase-shifter and applied to another input A of the comparator. In order that the delay introduced by the phase-shifter into the analog signal may be substantially the same as the delay given to the mean value by the RC circuit, the phase-shifter is made with the same RC circuit and an amplifier mounted so as to set up a phase shift transfer function of the $(1-RCp)/(1+RCp)$ type where $p$ is the Laplace variable.

9 Claims, 3 Drawing Sheets

CIRCUIT FOR THE DEMODULATION OF THE LOGIC SIGNAL TRANSMITTED BY ANALOG CHANNELS

BACKGROUND OF THE INVENTION

The invention relates to digital signal demodulation and detection circuits, especially digital radio signal reception and processing circuits.

The signals modulated by digital information are transmitted by physical circuits that deform these signal, in such a way that the signals have to be processed on arrival in order to retrieve the digital information that they contain. This processing is done by threshold demodulation circuits that convert the variations in analog level of the received signal into binary information (high-level or low-level binary information). This is the case even if the signals have undergone waveform degradation.

Typically, an antenna and amplitude-modulated or frequency-modulated radio signal received from an antenna is demodulated by an amplitude or frequency demodulator, which gives a low-frequency analog signal with a waveform that is rectangular in theory but highly degraded in practice. This signal is applied to a threshold comparator which decides whether the analog signal level received at a given point in time has to be considered as having a high or a low logic level. The comparator therefore carries out a conversion function to convert an analog signal into a logic signal, or again a logic decision-making function for taking a logic decision on the basis of an analog signal.

The threshold of the comparator cannot be fixed in practice because it depends far too much on parameters that may vary (with variable voltage levels, imprecise locking of the demodulators etc).

This is why it is usually preferred to use a comparison threshold that is the mean level of the analog signal. Indeed, the signal is modulated in a binary manner and therefore oscillates permanently as a function of the information that it conveys between its high level and its low level. Its mean level is therefore roughly midway between its high level and its low level.

It is therefore habitual to apply the following signals to the input of the comparator: firstly the analog signal representing the binary information to be detected and, secondly, a signal representing a threshold, this signal being formed by a mean value of the analog signal. Depending on whether the signal is above or below its mean value, the comparator will switch over in one direction of the other, thus converting the degraded waveform signal into a rectangular signal representing the binary information conveyed.

The mean value may be established by means of the simple lowpass filter that receives the analog signal and integrates it over a sufficient period of time.

The higher the time constant of the filter, the more efficient will be the measurement of the mean value, provided however that there is no overall change in the reception level of the signal. However, a high time constant implies a high acquisition time at the start. This may be incompatible with the many systems which are normally on standby and have to start as quickly as possible when an exit from the standby state is requested. Errors in the detection of binary information should not occur during the starting phase because of the time taken to build up a stable mean value. Furthermore, if the mean value of the reception level changes, for example in an application of reception in a mobile device, the system must be capable of adapting to the new mean value without delaying far too much, otherwise there will be loss of information.

A short time constant resolves this problem but if it is too short, it will fluctuate far too quickly and make the system far too sensitive to the noise present in the signal.

It is therefore necessary to have an intermediate time constant that is neither too great nor too small, corresponding for example to about 10 data bits.

However the mean value set up by a lowpass filter is a mean value that is delayed with respect to the reality of the arrival of the analog signal. In other words, the mean value provided at a given instant represents the mean value that the signal had a certain time before this instant. And the higher the time constant of the filter, the greater is the delay. The result of thereof is that, at a given point in time, the threshold comparator compares the signal not with its mean value but with a mean value that it had previously. This may falsify the information detected in applications where the mean value is not stable.

The present invention proposes to reduce this defect by delaying the analog signal by a quantity corresponding to the delay introduced by the filter that sets up the mean value, before applying this delayed signal to the input of the comparator which furthermore receives this mean value as a comparison threshold value

SUMMARY OF THE INVENTION

An object of the invention therefore is a circuit for the conversion of analog signals into logic values, comprising an analog signal input, a mean value filter receiving the signal present at the analog signal input to set up a mean value of this signal, and a threshold comparator having a first input and a second input, and receiving the mean value as a threshold value at the second input, wherein a phase-shifter circuit is interposed between the signal input and the first input of the comparator.

The phase shift introduced by the phase-shifter circuit is preferably such that the analog signal is delayed by a value roughly equal to the delay introduced by the mean value filter before it is applied to the input of the comparator.

The invention therefore provides a better guarantee that the analog signal will be compared with its true mean value and not with the previous mean value.

Preferably, the phase-shifter circuit is a circuit having at least one resistor with a value R connected to a capacitor with a value C. and having a transfer function H equal to $(1-RCp)/(1+RCp)$ where p is the Laplace variable. This type of transfer function corresponds to a phase shift identical to the one introduced by a simple lowpass RC filter. The association between this type of filter and a simple RC circuit therefore optimizes the desired compensation for delay in the present invention.

Furthermore, according to a particularly valuable characteristic of the invention, it has been noted that it is even possible to use the resistor R and capacitor C of the phase-shifter with the transfer function $(1-RCp)/(1+RCp)$ as a mean value filter so that there is no need for two distinct RC assemblies. In particular, it may be planned that the analog signal to be converted into a logic value is applied to the input of the phase-shifter comprising a series RC assembly and that the second input of the comparator (the input to representing the mean value of the analog signal) is connected to the junction point of the resistor R and the capacitor C In a first embodiment, the phase-shifter comprises an operational amplifier with a non-inverter input connected to the junction point of the resistor and the capacitor and an inverter input, with a second resistor between the signal input and the inverter input and a third resistor between the output of the amplifier and the inverter input.

In a second embodiment designed to prevent the use of a high-gain operational amplifier (which may raise problems of stability in a closed loop and therefore call for compensation capacitors), two amplifiers are used, one having negative unit gain and the other having a positive gain of 2, with an adder receiving the output of the two amplifiers. The input of the first amplifier is connected to the analog signal input. The input of the second amplifier is connected to the junction point of the resistor and the capacitor. The output of the adder gives the delayed analog signal to be applied to the comparator. The transfer function of the phase-shifter is the same as it is with a single operational amplifier.

BRIEF DESCRIPTION OF THE DRAWINGS

Other features and advantages of the invention shall appear from the following detailed description, made with reference to the appended drawings, of which.

MORE DETAILED DESCRIPTION

Figure 5:
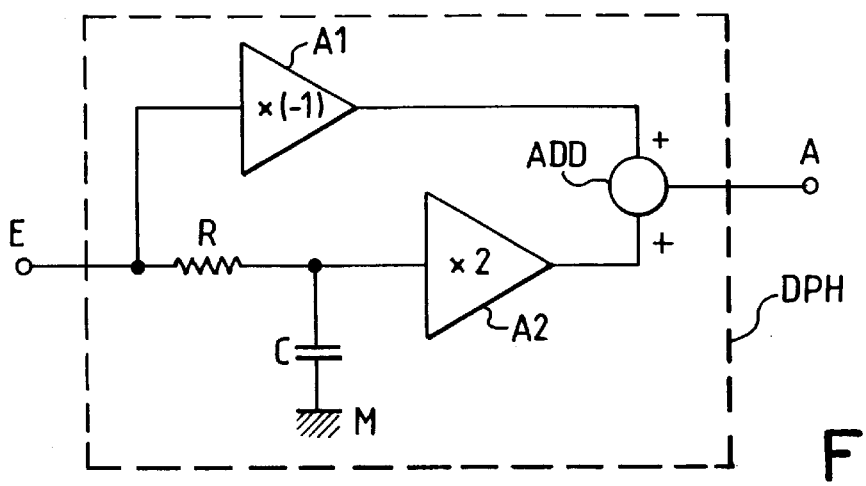
FIG. 5 shows another exemplary phase-shifter circuit.

FIG. 5, which represents the prior art, shows an input E that can receive an analog signal conveying a piece of binary information with a waveform that is degraded as compared with a rectangular wave signal. The binary information is detected by a threshold comparator COMP (a high-gain operational amplifier) which receives the analog signal at a first input A and a threshold value, constituted by the output of a lowpass filter, at a second input B. The input of the lowpass filter is the analog signal input E, and at its output it gives a signal representing the mean value of the analog signal. The lowpass filter is a simple series RC circuit connected between the input E and an electrical ground M, the output of the filter being the junction point of the resistor R and the capacitor C. At its output, the comparator COMP gives the binary result of the comparison between the level of the analog signal and the mean value of this analog signal. This circuit therefore constitutes a digital signal demodulation circuit, namely a circuit for the conversion of two-state analog signals into high and low logic signals.

The drawbacks of this type of detection have been pointed out further above: they result from the fact that the analog signal is not compared with its true mean value but with a delayed mean value.

Figure 2:
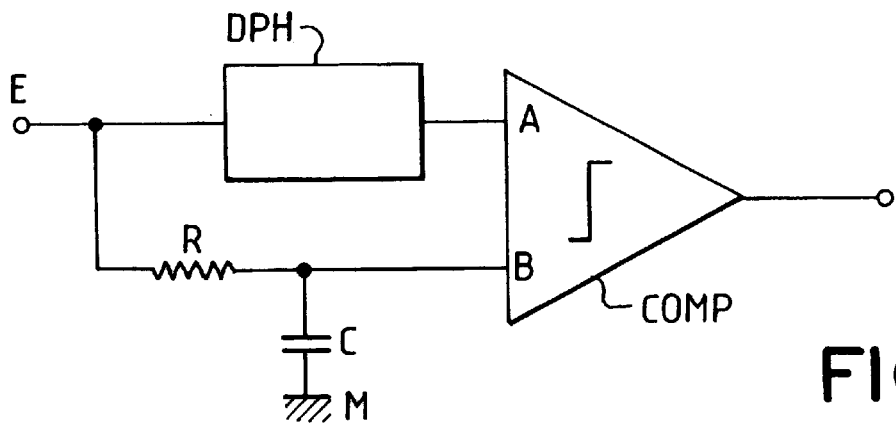
FIG. 2 shows a demodulation circuit according to the invention.

FIG. 2 is a circuit diagram showing the principle of the present invention: a phase-shifter DPH introducing a delay that is roughly equivalent to the delay introduced by the RC filter is inserted between the input E and the first input A of the comparator COMP. The delayed analog signal is then compared with the mean value so that the comparison between the signal and its mean value is no longer disturbed by the delay introduced by the lowpass filter which establishes the mean value.

Figure 1:
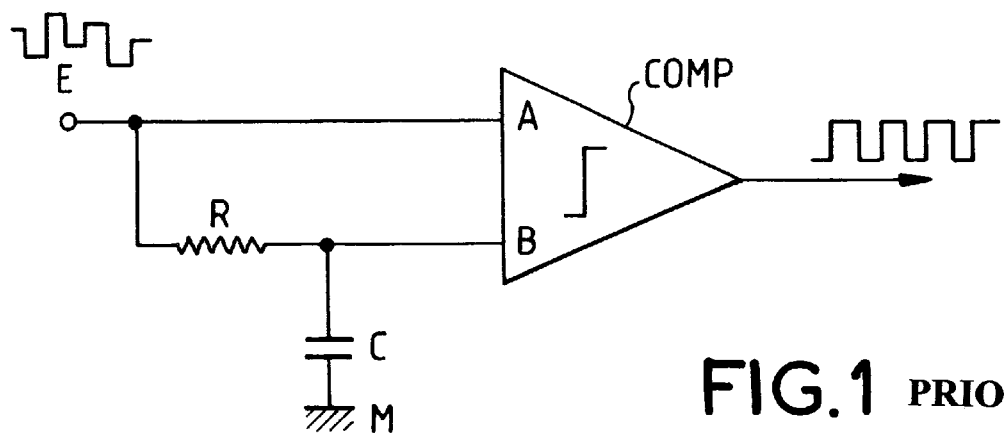
FIG. 1 shows a prior art digital signal demodulation circuit.
Figure 3:
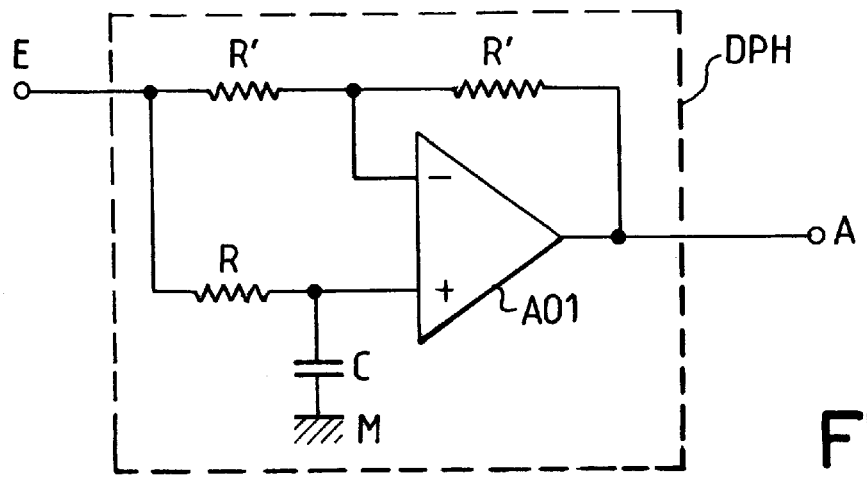
FIG. 3 shows a phase-shifter circuit that can be used in the invention.

FIG. 3 is a view of the structure of a phase-shifter that can be used in the drawing of FIG. 2, between the input E and the input A. A phase-shifter of this kind uses an operational amplifier AO1 having an inverter input (−) and a non-inverter input (+), an input resistor with a value R between the signal input E and the non-inverter input, a capacitor with a value C. between a non-inverter input and an electrical ground, an input resistor with a value R' between the input E and the inverter input, and finally a loop resistor with the same value R' between the inverter input and the output of the amplifier AO1; this output of the amplifier AO1 constitutes the output of the phase-shifter, designed to be applied to the input A of the comparator COMP. A circuit of this kind is a pure phase-shifter introducing a phase-shift arctan($2\pi fRC$) for a frequency f. Its transfer function is equal to $(1-RCp)/(1+RCp)$, p being the Laplace variable. The phase shift is identical to the one introduced by the lowpass RC filter of FIG. 1 so that the use of the phase-shifter of FIG. 2 in the diagram of FIG. 1 truly compensates for the delay in mean value introduced by the lowpass filter.

It will be noted that, to obtain this identical phase shift, it is enough to use a time constant RC in the phase-shifter of FIG. 2 on the non-inverter input. This time constant is the same as the time constant RC of the lowpass filter of FIG. 1. This is why, for the phase-shifter, it has been chosen to use a resistor with a value R identical to that of the lowpass filter and a value C. identical to that of the lowpass filter.

In addition, however, since the consideration of the connection of the RC series assembly is the same for the phase-shifter and for the lowpass filter, i.e. since in both cases the resistor is connected to the signal input E and the capacitor is connected to the ground, it is possible to simply use the same series RC circuit for both the lowpass filter and the phase-shifter. This is what is shown in FIG. 4 which is a practical diagram of the implementation of the invention.

Figure 4:
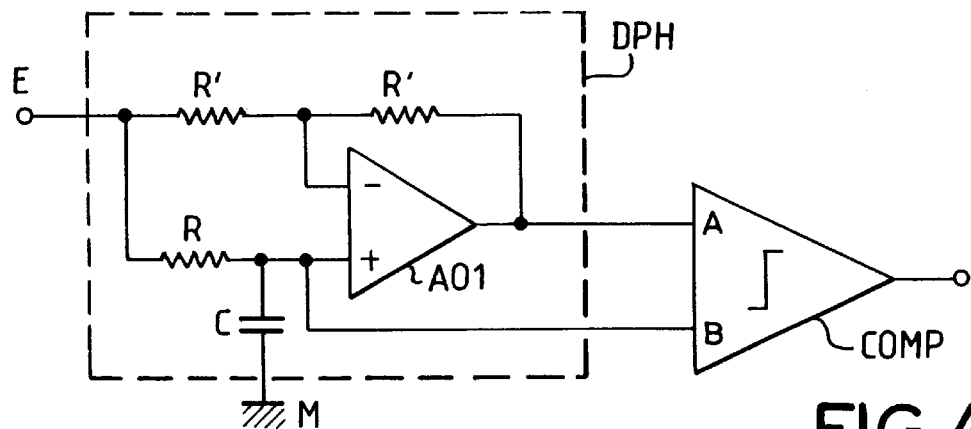
FIG. 4 shows a circuit according to the invention incorporating the phase-shifter of FIG. 3.

In FIG. 4, a single series RC assembly is connected between the analog signal input E and the ground M. The resistor is connected to the input E while the capacitor is connected to the ground. The junction point of the resistor and the capacitor is connected to the non-inverter input of the operational amplifier AO1. An input resistor with a value R' is connected between the input E and the inverter input of AO1, and another resistor with the same value R' is connected between the output of AO1 and the inverter input. The output of the amplifier AO1, therefore, according to the drawing of FIG. 3, gives an analog signal phase-shifted by arctan($2\pi fRC$) with respect to the signal at the input E. This phase-shifted signal is applied to the first input A of the threshold comparator COMP. The junction point of the resistor R and the capacitor C represents the mean value of the signal in accordance with FIG. 1, and it is simply connected to the second input B of the comparator COMP. The output of the comparator gives the detected logic signal.

FIG. 5 shows an alternative embodiment of the phase-shifter, designed to prevent the use of an operational amplifier. Indeed, a pure phase-shift can be obtained with a circuit of FIG. 3 only on condition that the operational amplifier is almost ideal. In practice, this leads to an embodiment that is bulky in terms of integrated circuits: the amplifier would have several transistor stages and would consume a large amount of current.

The phase-shifter DPH of FIG. 5 has two amplifiers A1 and A2, one with negative unit gain and the other with a positive gain of 2, and an adder ADD that receives the output of these two amplifiers. The input of the unit-gain amplifier consists of the signal input E. The input of the gain of 2 amplifier is constituted by the junction point between the resistor R and capacitor C The output of the adder ADD gives an analog signal whose level is the sum of the output levels of the two amplifiers. The transfer function of this circuit, between the input E and the output of the adder, is equal to −1+2/(1+Rcp), or again $$(1-RCp)/(1+RCp)$$

This function is the desired phase-shifter function and therefore the circuit of FIG. 2 plays the same role, with a facilitated practical embodiment, as that of FIG. 3.

Figure 6:
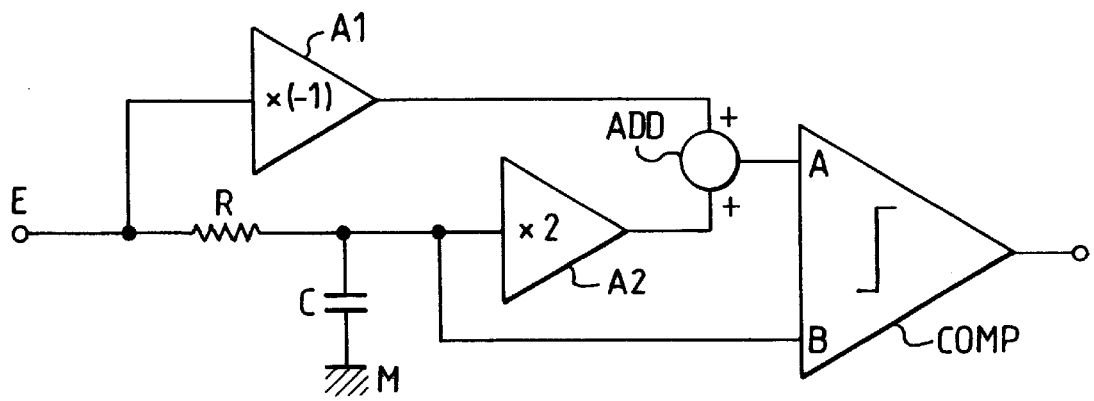
FIG. 6 shows a circuit according to the invention using the phase-shifter of FIG. 5.

FIG. 6 shows the conversion circuit for the conversion of analog signals into logic signals using the phase-shifter of FIG. 5: the output of the adder ADD is applied to the first input B of the comparator COMP while the junction point of the resistor R and the capacitor C of the phase-shifter is applied to the second input B of the comparator.

It will be noted that the above description corresponds to the conversion of a non-differential input analog signal (hence a signal applied between the input E and the ground M). It will be understood that the principles of the invention can be transposed to the case where the analog input signal is a differential signal. In this case, two RC circuits will be needed, each connected between a differential input and the ground. The unit gain amplifier and the gain of 2 amplifier will be differential. The summation (the function of the adder ADD) can be done by the simple addition of output currents of the amplifiers in load resistors, and finally the comparator COMP will be a differential input comparator.

Figure 7:
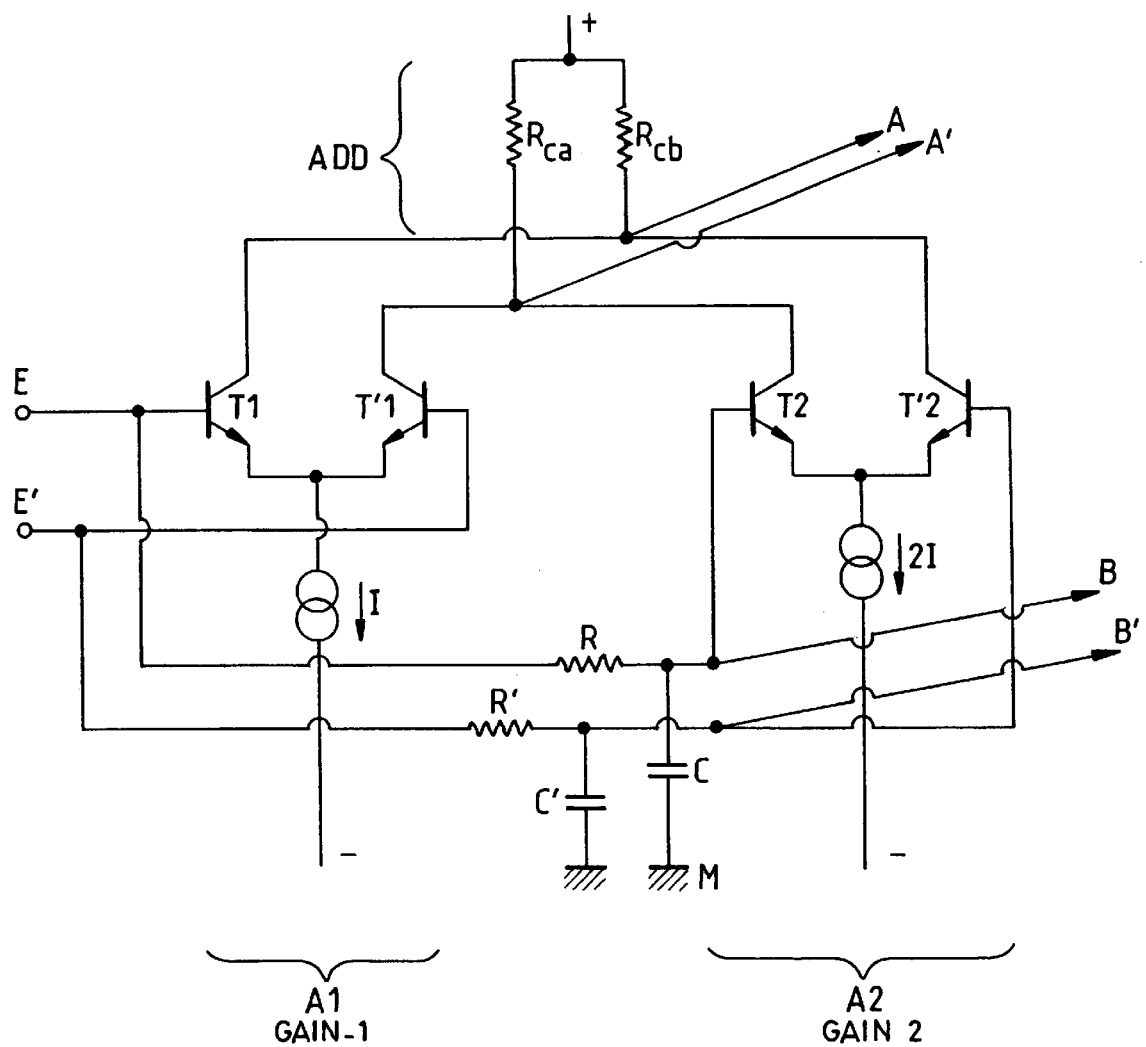
FIG. 7 shows a practical embodiment of the invention in the case of a differential analog signal.

FIG. 7 gives an exemplary view of a practical possibility, in a differential structure, of the phase-shifter of FIG. 5.

There are two analog signal inputs E and E', between which the input analog signal is applied. The inputs E and E' are applied to the bases of two transistors T1 and T'1 constituting a differential pair of a negative unit gain amplifier stage A1. The emitters of the transistors, connected together, are powered through a constant power source I. The collectors of the transistors T1 and T'1 are connected to identical load resistors Rcb and Rca, and these collectors constitute differential current outputs of the differential amplifier stage A1. This is a standard two-transistor differential stage.

The input E and E' are furthermore connected to two identical series RC assemblies, comprising a resistor R and a capacitor C for the first assembly, a resistor R' and capacitor C' for the second assembly. The inputs are connected to the resistors. The capacitors are connected to the ground, and the junction point of the resistor and the capacitor is connected to a respective input of another differential amplifier stage A2 with a positive gain of 2. The differential stage A2 has a pair of transistors T2, T'2 receiving the junction point of the resistors and capacitors at their bases. The emitters of the pair of transistors are powered by a current source with a value twice I, where I is the current of the source powering the pair T1, T'1.

The collectors of the transistors T2 and T'2 are connected to identical load resistors, and these collectors constitute the output of the differential stage A2 which has a very conventional structure.

To make the adder ADD, it is enough to use the same load resistors Rca and Rcb for the two differential stages A1 and A2, The differences in current generated in the transistors T1, T'1 by the voltage imbalance at the bases of these transistors get added to the current differences generated in the transistors T2, T'2 by the voltage imbalance at the bases of these transistors. The use of a current source with a double value for the transistors T2 and T'2 defines a gain that is twice the gain of the pair T1, T'1. An intersection of the collectors of the transistors defines a gain with an opposite sign for the two amplifiers: the collector of the transistors T1, corresponding to the input E, and the collector of the transistor T'2, corresponding to the input E', are connected to the resistor Rcb and, conversely, the collectors of the transistors T'1 (corresponding to the input E') and T2 (corresponding to the input E) are connected to the resistor Rca. The common load resistors Rca and Rcb therefore fulfill the function of the adder ADD of FIG. 5, the differential output of this adder being taken between the collectors of the pairs of transistors.

The differential signal between the bases of the transistors T2 and T'2 representing the mean input signal value filtered by the circuits, RC, R'C', will be applied to a first pair of differential inputs B,B' of a differential input comparator (not shown) while the differential signal between the collectors of the transistors T2, T'2, representing the phase-shifted differential input signal, will be applied to a second pair of differential inputs A, A' of the comparator. The comparator will give the desired logic information, by comparison between, firstly, the differential signal level between the inputs A and A' and, secondly, the differential signal level between the input B and B'.

An appropriate choice of the load resistor values, the current source and the gain values of the transistors ensures that the voltage level between the inputs A, A' will be equal to the voltage level between the inputs B,B' for an alternating input signal with a stable mean value.

What is claimed is:

1. A circuit for the conversion of analog signals into logic values, said circuit comprising:
    an analog signal input,
    a circuit for establishing a mean value receiving the signal present at the analog signal input to establish a mean value of this signal, and
    a threshold comparator having a first input and a second input, and receiving the mean value as a threshold value at the second input,
    wherein the circuit for establishing a mean value comprises at least one resistor with a value R series-connected with a capacitor with a value C, and wherein a phase-shifter circuit is interposed between the signal input and the first input of the comparator, the phase-shifter circuit comprising at least one resistor and one capacitor having values of R and C which are tha same as the values of R and C of the at least one resistor and capacitance of the mean value circuit, and possessing a transfer function H equal to (1−RCp)/(1+RCp) where p is the Laplace variable.

2. A conversion circuit according to claim 1, wherein the phase shift introduced by the phase-shifter circuit is such that the analog signal is delayed by a value practically equal to the delay introduced by the mean value filter before it is applied to the input of the comparator.

3. A conversion circuit according to one of the claims 1 and 2, wherein said at least one resistor R and said capacitor C are common to the phase-shifter circuit and to the circuit for establishing a mean value.

4. A mean-value conversion circuit according to claim 3, wherein the phase-shifter comprises an operational amplifier with a non-inverter input connected to the junction point of said at least one resistor and said capacitor and an inverter input, with a second resistor between the signal input and the inverter input and a third resistor between the output of the amplifier and the inverter input.

5. A conversion circuit according to one of the claim 4, wherein the signal input is a differential input and wherein the phase-shifter circuit and the comparator have differential inputs.

6. A conversion circuit according to claim 3, wherein the phase-shifter circuit comprises two amplifiers, one having negative unit gain and the other having a positive gain of 2, with an adder receiving the outputs of the two amplifiers, the input of the first amplifier being connected to the analog signal input, the input of the second amplifier being connected to the junction point of said at least one resistor and said capacitor, and the output of the adder giving the delayed analog signal to be applied to the comparator.

7. A conversion circuit according to one of the claim 6, wherein the signal input is a differential input and wherein the phase-shifter circuit and the comparator have differential inputs.

8. A conversion ciruit according to one of the claim 3, wherein the signal input is a differential input and wherein the phase-shifter circuit and the comparator have differential inputs.

9. A conversion circuit according to one of the claims 1 and 2, wherein the signal input is a differential input and wherein the phase-shifter circuit and the comparator have differential inputs.

* * * * *